United States Patent [19]
Laskaris et al.

[11] Patent Number: 5,446,433
[45] Date of Patent: Aug. 29, 1995

[54] SUPERCONDUCTING MAGNET HAVING A SHOCK-RESISTANT SUPPORT STRUCTURE

[75] Inventors: Evangelos T. Laskaris, Schenectady; Constantinos Minas, Slingerlands; Robert A. Ackermann, Schenectady, all of N.Y.

[73] Assignee: General Electric Company, Schenectady, N.Y.

[21] Appl. No.: 309,700

[22] Filed: Sep. 21, 1994

[51] Int. Cl.$^6$ ................................. H01F 7/22
[52] U.S. Cl. ...................... 335/216; 62/51.1; 505/898
[58] Field of Search ............ 335/216; 62/51.1; 505/892, 893, 898

[56] References Cited

U.S. PATENT DOCUMENTS

| | | | |
|---|---|---|---|
| 4,878,351 | 11/1989 | Weber et al. | 62/51.1 |
| 4,924,198 | 5/1990 | Laskaris . | |
| 4,935,714 | 6/1990 | Vermilyea . | |
| 4,986,078 | 1/1991 | Laskaris . | |
| 5,032,869 | 7/1991 | Herd et al. . | |
| 5,034,713 | 7/1991 | Herd et al. . | |
| 5,083,105 | 1/1992 | Herd et al. . | |

OTHER PUBLICATIONS

U.S. patent application Ser. No. 08/181,514, filed Aug. 5, 1994, by Evangelos T. Laskaris et al., entitled "Open MRI Magnet Having A Support Structure".

*Primary Examiner*—Leo P. Picard
*Assistant Examiner*—Raymond M. Barrera
*Attorney, Agent, or Firm*—Douglas E. Erickson; Paul R. Webb, II

[57] ABSTRACT

A superconductive magnet having a superconductive coil located within a thermal shield located within a vacuum enclosure. A cryocooler coldhead's first stage is in solid-conductive thermal contact with the thermal shield, and its second stage is in solid-conductive thermal contact with the superconductive coil. A magnet re-entrant support assembly includes an outer support cylinder located between the vacuum enclosure and the thermal shield and includes an inner support cylinder located between the thermal shield and the superconductive coil. The outer support cylinder's first end is rigidly connected to the vacuum enclosure, and its second end is rigidly connected to the thermal shield. The inner support cylinder's first terminus is rigidly connected to the thermal shield near the outer support cylinder's second end, and its second terminus is located longitudinally between the outer support cylinder's first and second ends and is rigidly connected to the superconductive coil.

10 Claims, 3 Drawing Sheets

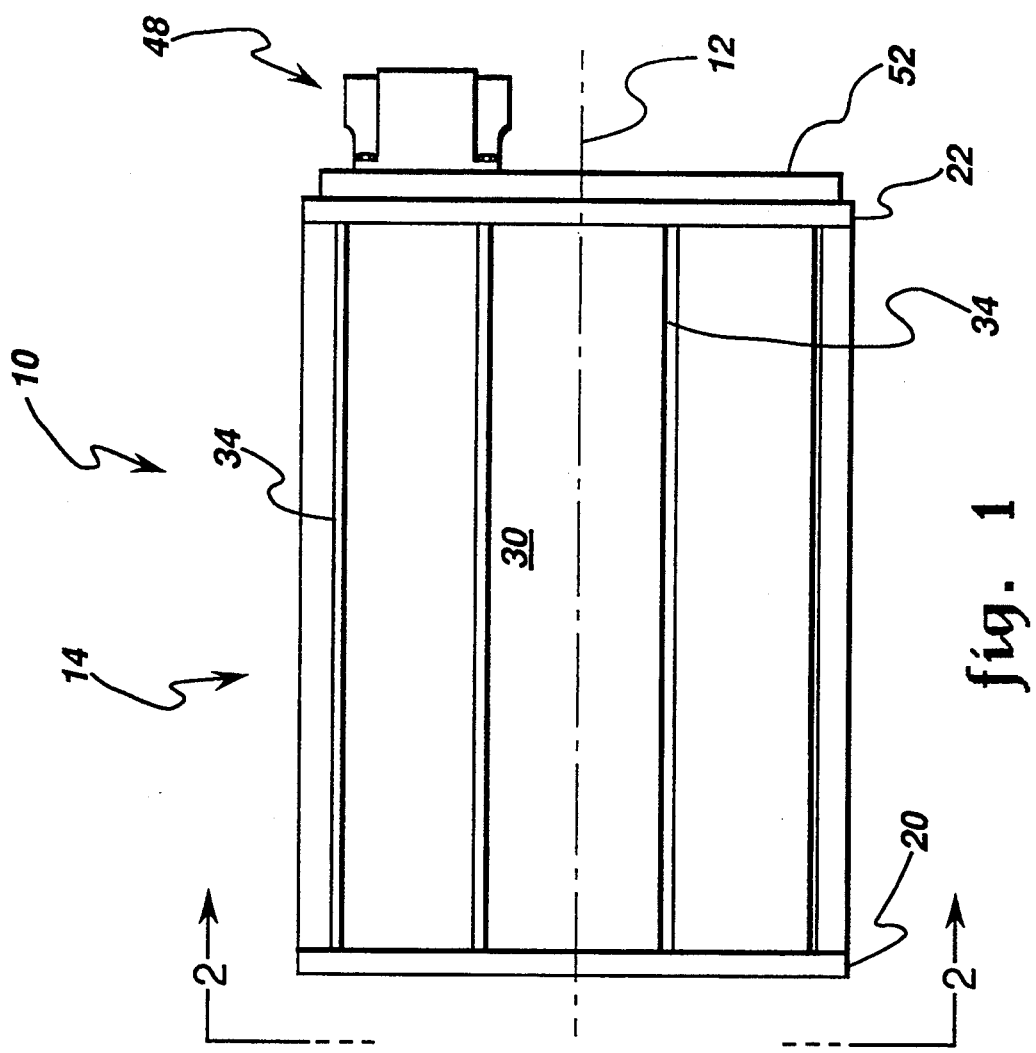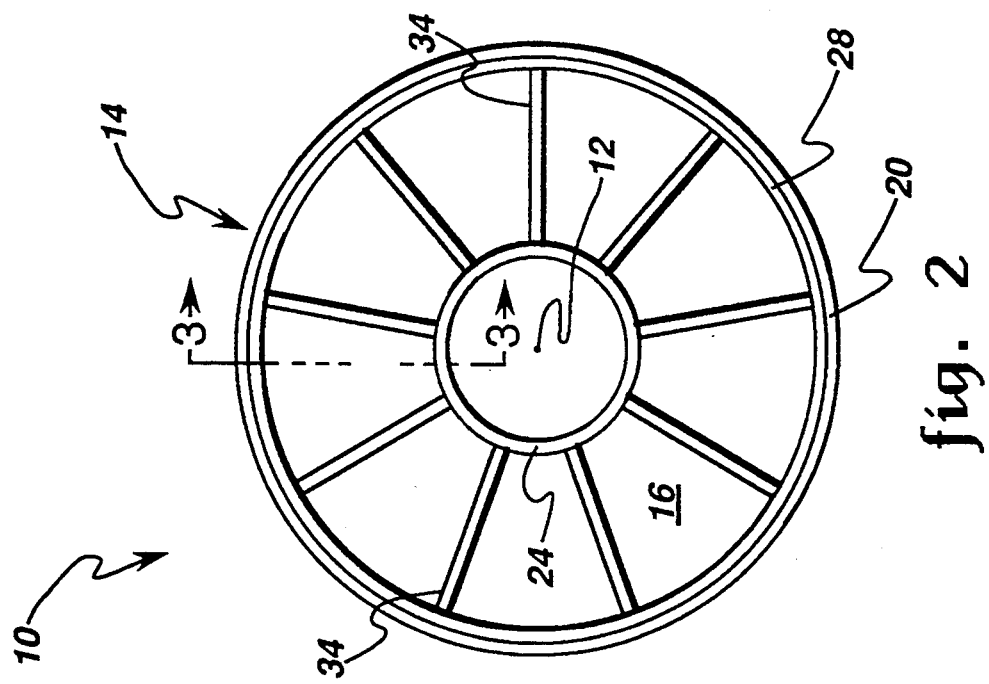

SUPERCONDUCTING MAGNET HAVING A SHOCK-RESISTANT SUPPORT STRUCTURE

This invention was made with Government support under Government Contract No. N61533-93-C-0074 awarded by the Navy. The Government has certain rights to this invention.

BACKGROUND OF THE INVENTION

The present invention relates generally to a superconductive magnet cooled through solid conduction by a cryocooler coldhead, and more particularly to such a magnet having a support structure which is resistant to shock and vibration forces.

Superconducting magnets include superconductive coils which generate uniform and high strength magnetic fields. Superconducting magnets include those used in magnetic resonance imaging (MRI) systems employed in the field of medical diagnostics. Known techniques for cooling a superconductive magnet include those in which the superconductive coil is cooled through solid conduction by a cryocooler coldhead.

Known magnets include those in which the superconductive coil is surrounded with a spaced-apart thermal shield which is surrounded with a spaced-apart vacuum enclosure. The first stage of the cryocooler coldhead is in solid-conductive thermal contact with the thermal shield, and the second stage of the cryocooler coldhead is in solid-conductive thermal contact with the superconductive coil. Thermal insulating tubes, typically made of radial filamentary carbon graphite, position the thermal shield with respect to the superconductive coil. Racetrack-shaped tie rod straps, typically made of filamentary glass or carbon graphite, support the superconductive coil from the vacuum enclosure. In an alternate known support system, the superconductive coil is vertically supported by a "bar-stool" pedestal stand which provides no horizontal support.

Superconductive magnets are sometimes subject to shock and vibration forces. For example, an MRI magnet is susceptible to shock and vibration forces during shipping and installation, and a naval magnet is susceptible to shock and vibration forces while in use during mine-sweeping operations. Shock and vibration forces during shipping and installation subject the superconductive coil to deflections within the vacuum enclosure leading to frictional heating at the magnet's suspension points which can prevent superconductive operation, as can be appreciated by those skilled in the art. Likewise, shock and vibration forces during magnet operation subject the superconductive coil to deflections within the vacuum enclosure leading to frictional heating at the magnet's suspension points which can cause the magnet to quench (i.e., lose its superconductivity). Known magnet supports employing tie rod straps or pedestal stands provide limited or no protection of the superconductive coil against deflections due to shock and vibration forces. What is needed is a cryocooler-cooled superconductive magnet with an improved magnet support structure.

SUMMARY OF THE INVENTION

It is an object of the invention to provide a cryocooler-cooled superconductive magnet with an improved magnet support structure for better protection against frictional heating due to shock and vibration forces.

The superconductive magnet of the invention includes an axis, a vacuum enclosure, a thermal shield, a superconductive coil, a cryocooler coldhead, and a magnet re-entrant support assembly. The axis extends generally longitudinally. The vacuum enclosure and the thermal shield are each generally annularly-cylindrical in shape and are each generally coaxially aligned with the axis, with the thermal shield located within and spaced apart from the vacuum enclosure. The superconductive coil is generally solenoidal in shape, generally coaxially aligned with the axis, and located within and spaced apart from the thermal shield. The cryocooler coldhead has a housing connected to the vacuum enclosure, a first stage positioned in solid-conductive thermal contact with the thermal shield, and a second stage positioned in solid-conductive thermal contact with the superconductive coil. The magnet re-entrant support assembly includes an outer support cylinder and an inner support cylinder each generally annularly-cylindrical in shape and each generally coaxially aligned with the axis. The outer support cylinder is located within and generally spaced apart from the vacuum enclosure and is located outside and generally spaced apart from the thermal shield, and the inner support cylinder is located within and generally spaced apart from the thermal shield and is located outside and generally spaced apart from the superconductive coil. The outer support cylinder has a first end rigidly connected to the vacuum enclosure and has a second end rigidly connected to the thermal shield. The inner support cylinder has a first terminus rigidly connected to the thermal shield near the second end of the outer support cylinder and has a second terminus positioned longitudinally between the first and second ends of the outer support cylinder and rigidly connected to the superconductive coil. Preferably, the outer and inner support cylinders each include a fiberglass cylinder wound from glass fibers with a generally 45 degree by −45 degree overlapping pitch.

Several benefits and advantages are derived from the invention. The outer and inner support cylinders of the magnet re-entrant support assembly rigidly support the superconductive coil from the vacuum enclosure to minimize frictional heating under shock and vibration forces. The fiberglass outer support cylinder minimizes heat transfer from the vacuum enclosure to the thermal shield, and the fiberglass inner support cylinder minimizes heat transfer from the thermal shield to the superconductive coil. Also, the magnet re-entrant support assembly has the outer support cylinder circumferentially surround and longitudinally overlap the inner support cylinder. This results in a longer heat path between components of different temperatures which better thermally isolates the superconductive coil while maintaining a compact magnet design.

BRIEF DESCRIPTION OF THE DRAWINGS

The accompanying drawings illustrate a preferred embodiment of the present invention wherein:

FIG. 1 is a schematic front elevational view of a preferred embodiment of the superconductive magnet of the present invention;

FIG. 2 is a schematic side elevational view of the magnet of FIG. 1 taken along lines 2—2 of FIG. 1;

DETAILED DESCRIPTION OF THE INVENTION

Figure 3:
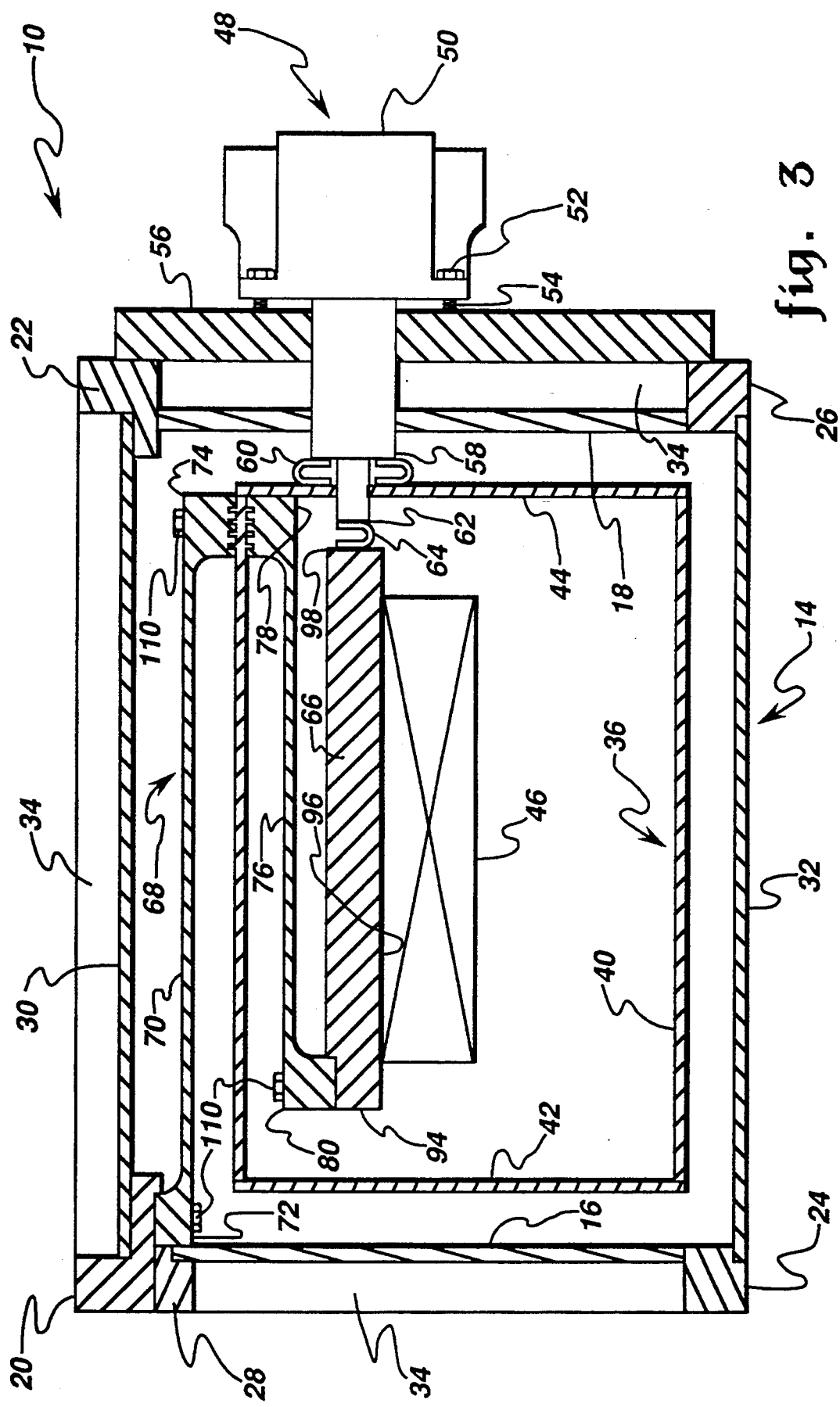
FIG. 3 is a schematic cross sectional view of the magnet of FIG. 2 taken along lines 3—3 of FIG. 2.

Referring now to the drawings, wherein like numerals represent like elements throughout, FIGS. 1–6 show a preferred embodiment of the superconductive magnet 10 of the present invention. The magnet 10 includes a generally longitudinally extending axis 12 and a generally annularly-cylindrical-shaped vacuum enclosure 14 generally coaxially aligned with the axis 12. Preferably, the vacuum enclosure 14 includes longitudinally spaced-apart first and second end plates 16 and 18, first and second outer and inner mounting rings 20, 22, 24, and 26, a ring clamp 28, and outer and inner cylindrical tubes 30 and 32. The end plates 16 and 18 and the cylindrical tubes 30 and 32 each have spaced apart ribs 34 for added structural stiffness. The first end plate 16 has its inner circumferential edge attached to the first inner mounting ring 24 and has its outer circumferential edge connected to the first outer mounting ring 20 via the ring clamp 28. The second end plate 18 has its inner circumferential edge attached to the second inner mounting ring 26 and has its outer circumferential edge attached to the second outer mounting ring 22. The outer cylindrical tube 30 has one end attached to the first outer mounting ring 20 and has its other end attached to the second outer mounting ring 22. The inner cylindrical tube 32 has one end attached to the first inner mounting ring 24 and has its other end attached to the second inner mounting ring 26. Preferably, all attachments are by welding.

The magnet 10 also includes a generally annularly-cylindrical-shaped thermal shield 36 generally coaxially aligned with the axis 12 and disposed within and spaced apart from the vacuum enclosure 14. Preferably, the thermal shield 36 includes outer and inner tubes 38 and 40 attached at their ends to longitudinally spaced-apart first and second plates 42 and 44. A preferred attachment is by welding.

The magnet 10 further includes a generally solenoidal-shaped superconductive coil 46 generally coaxially aligned with the axis 12 and disposed within and spaced apart from the thermal shield 36. The magnet 10 is provided with a cryocooler coldhead 48 (such as that of a Gifford-McMahon cryocooler) having a housing 50 connected to the vacuum enclosure 14 (such as via bolts 52 which pass through a shock-absorbing collar 54 and which are threaded to a mounting plate 56 welded to the second outer and inner mounting rings 22 and 26). The cryocooler coldhead 48 also has a first stage 58 disposed in solid-conductive thermal contact with the thermal shield 36 (such as via a flexible thermal busbar 60) and a second stage 62 disposed in solid-conductive thermal contact with the superconductive coil 46 (such as via a flexible thermal busbar 64 and a coil overband 66).

The magnet 10 additionally includes a magnet reentrant support assembly 68. Assembly 68 includes a generally annularly-cylindrical-shaped outer support cylinder 70 generally coaxially aligned with the axis 12, disposed within and generally spaced apart from the vacuum enclosure 14, disposed outside and generally spaced apart from the thermal shield 36, having a first end 72 rigidly connected to the vacuum enclosure 14, and having a second end 74 rigidly connected to the thermal shield 36. Assembly 68 further includes a generally annularly-cylindrical-shaped inner support cylinder 76 generally coaxially aligned with the axis 12, disposed within and generally spaced apart from the thermal shield 36, disposed outside and generally spaced apart from the superconductive coil 46, having a first terminus 78 rigidly connected to the thermal shield 36 proximate the second end 74 of the outer support cylinder 70, and having a second terminus 80 disposed longitudinally between the first and second ends 72 and 74 of the outer support cylinder 70 and rigidly connected to the superconductive coil 46 (such as via the coil overband 66).

Figure 4:
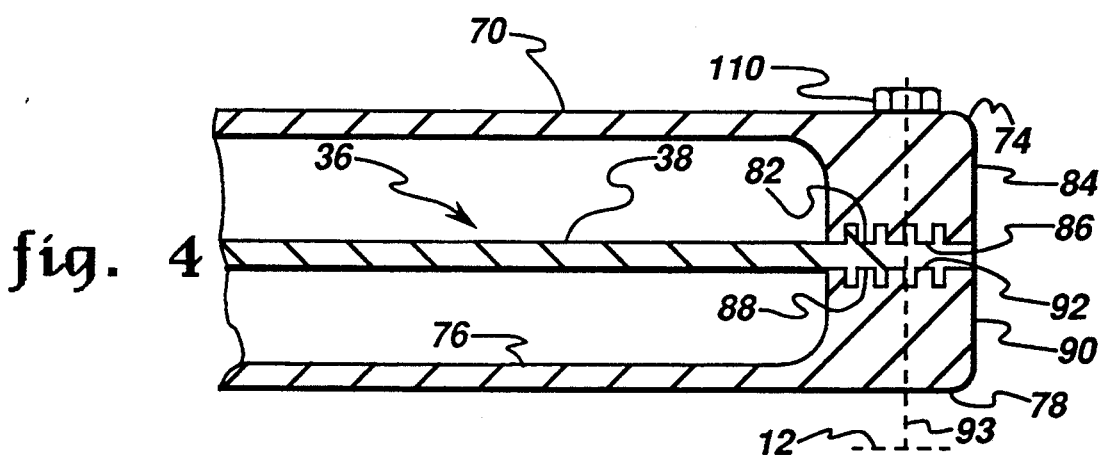
FIG. 4 is an enlarged view of the right-hand portion of the thermal shield and the outer and inner support cylinders of FIG. 3, showing a circumferential ridge and groove attachment.

In an exemplary embodiment, seen in FIG. 4, the thermal shield 36 has a plurality of spaced-apart and radially-outward-facing circumferential grooves 82, and the second end 74 of the outer support cylinder 70 includes a radially-inward extending flange 84 having a plurality of spaced-apart and radially-inward facing circumferential ridges 86 engaging the radially-outward-facing circumferential grooves 82 of the thermal shield 36. In this embodiment, the thermal shield 36 also has a plurality of spaced-apart and radially-inward facing circumferential grooves 88, and the first terminus 78 of the inner support cylinder 76 includes a radially-outward extending flange 90 having a plurality of spaced-apart and radially-outward-facing circumferential ridges 92 engaging the radially-inward-facing circumferential grooves 88 of the thermal shield 36. This fitting arrangement forms a strong connection between members without creating large stresses.

Preferably, the radially-inward-extending flange 84 of the second end 74 of the outer support cylinder 70 and the radially-outward-extending flange 90 of the first terminus 78 of the inner support cylinder 76 are generally aligned along a radius line from the axis 12.

As previously mentioned, the magnet 10 preferably includes a generally annularly-cylindrical-shaped coil overband 66 generally coaxially aligned with the axis 12, disposed inside and generally spaced apart from the inner support cylinder 76, disposed outside the superconductive coil 46, having a first end portion 94 rigidly connected to the second terminus 80 of the inner support cylinder 76, and having a radially-inward-facing surface 96 rigidly connected to (e.g., by shrink-fitting), and in solid-conductive thermal contact with, the superconductive coil 46. A cloth layer (not shown in the figures) may be interposed between the radially-inward-facing surface 96 of the coil overband 66 and the superconductive coil 46 to make a better solid-conductive thermal contact between such surface 96 and such coil 46. It is noted that the coil overband 66 has a second end portion 98, and that the second stage 62 of the cryocooler coldhead 48 is in solid-conductive thermal contact with the second end portion 98 of the coil overband 66 (via the flexible thermal busbar 64).

Figure 5:
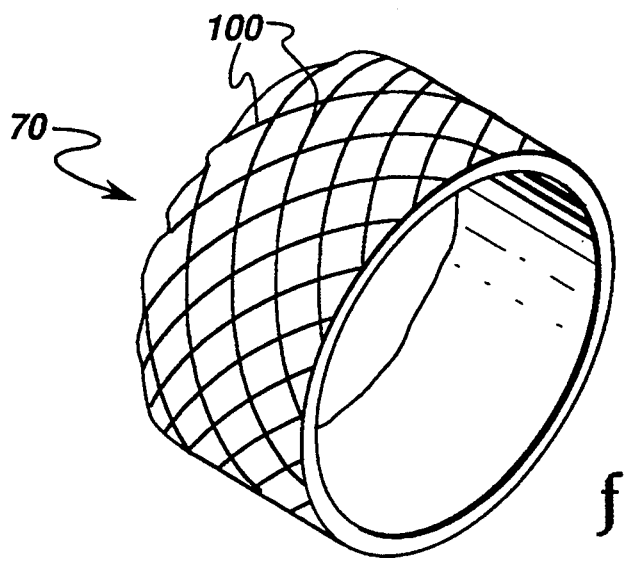
FIG. 5 is a perspective view of the middle portion of the outer support cylinder (which is generally identical in shape and construction to the middle portion of the inner support cylinder) of FIG. 3, showing wound glass fibers having a 45 degree by −45 degree overlapping pitch.

In a preferred embodiment, as seen in FIG. 5, the outer support cylinder 70 comprises a fiberglass cylinder wound from glass fibers 100 with a generally 45 degree by −45 degree overlapping pitch. Likewise the inner support cylinder 76 also comprises a fiberglass cylinder wound from glass fibers (not separately shown in the figures) with a generally 45 degree by −45 degree overlapping pitch. Such 45 degree by −45 degree overlapping pitch provides structural strength and stiffness in both the axial and the in-plane shear directions. The middle portion of the inner support cylinder 76 is generally identical in shape to the middle portion of the outer support cylinder 70 shown in FIG. 5. Preferably, the outer and inner support cylinders 70 and 76 are made by winding glass cloth under high tension on a stepped aluminum mandrel to obtain a 50–60% volume fraction of glass. The wound form is then epoxy-impregnated by vacuum pressure impregnation to give a void-free composite. It is noted that fiber-glass is a low thermal conductivity material, and that the outer and inner support cylinders 70 and 76 have a small cross sectional area to length ratio to provide a high thermal impedance to minimize the thermal conductivity along the outer and inner support cylinders 70 and 76 to thermally isolate the superconductive coil 46. In an exemplary embodiment, the initial wrap of glass roving is wound in the circumferential direction to provide hoop strength to the outer and inner support cylinders 70 and 76 and prevent ovalizing of the outer and inner support cylinders 70 and 76 when subject to bending loads.

Figure 6:
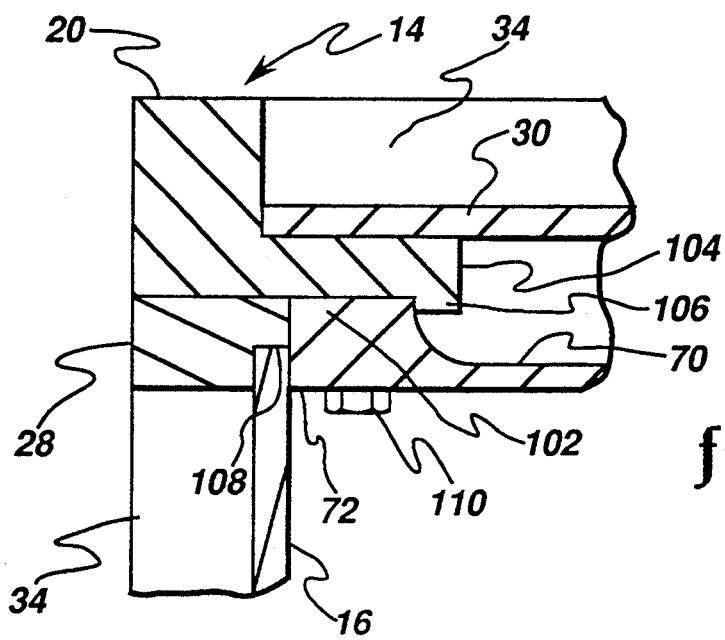
FIG. 6 is an enlarged view of the left-hand portion of the vacuum enclosure and outer support cylinder of FIG. 3, showing design details.

Preferably, as seen in FIG. 6, the first end 72 of the outer support cylinder 70 has a radially-outward-facing flange 102 rigidly connected to the vacuum enclosure 14. As previously mentioned, the vacuum enclosure 14 preferably includes a first outer mounting ring 20 which is generally coaxially aligned with the axis 12, which is disposed in circumferentially-surrounding contact with the radially-outward-facing flange 102 of the outer support cylinder 70, and which has a generally annular-shaped end 104 longitudinally disposed between the first and second ends 72 and 74 of the outer support cylinder 70. The annular-shaped end 104 includes a radially-inward-facing flange 106 radially overlapping and longitudinally abutting the radially-outward-facing flange 102 of the outer support cylinder 70. Also, as previously mentioned, the vacuum enclosure 14 includes a first end plate 16 and a ring clamp 28. The ring clamp 28 is longitudinally disposed to longitudinally hold the radially-outward-facing flange 102 of the outer support cylinder 70 longitudinally against the radially-inward-facing flange 106 of the first outer mounting ring 20, and the ring clamp 28 is radially disposed inside and rigidly connected (preferably by welding) to the first outer mounting ring 20. The ring clamp 28 and the radially-outward-facing flange 102 of the outer support cylinder 70 together define a radially-inward-facing circumferential notch 108, and the first end plate 16 has an outer circumferential edge disposed in the radially-inward-facing circumferential notch 108. Assembly of the magnet 10 is generally from the inside out with the ring clamp 28 being the final assembly piece, as can be appreciated by those skilled in the art.

It is noted that, where not specifically defined, rigid connections can be made by using mechanical fasteners (such as bolts 110) or by using metallurgical attachments (such as welding). Preferably, rigid connections are made by adhesive bonds backed by mechanical fasteners to minimize frictional heating under shock and vibration forces.

Typically the superconductive coil 46 is cooled to a temperature of generally ten Kelvin, and the thermal shield 36 is cooled to a temperature of generally forty Kelvin.

Preferably, the superconductive coil 46 comprises niobium-tin superconductive tape, the thermal shield 36 and the coil overband 66 are each made of aluminum, and the vacuum enclosure 14 is made of nonmagnetic stainless steel (or aluminum). As previously mentioned, the outer and inner support cylinders 70 and 76 are each made of fiber-glass.

As can be appreciated by those skilled in the art, the previously-described present invention provides a superconductive magnet 10 with a magnet re-entrant support assembly 68. The term "re-entrant" refers to the support assembly 68 having its outer support cylinder 70 start at the vacuum enclosure 14 and extend in a first direction forward along the axis 12 where it is rigidly connected to its inner support cylinder 76 (via the thermal shield 36) which then extends in the opposite direction back along the axis 12 where it is rigidly connected to the superconductive coil 46 (via the coil overband 66) which then extends in the first direction forward along the axis 12. The magnet re-entrant support assembly 68 provides high bending, in-plane shear strength and axial stiffness which results in a structurally strong magnet support with minimal displacement and minimal frictional heating under shock and vibration forces. This enables the superconductive magnet 10 to maintain its superconductivity under such shock and vibration forces.

The foregoing description of a preferred embodiment of the invention has been presented for purposes of illustration. It is not intended to be exhaustive or to limit the invention to the precise form disclosed, and obviously many modifications and variations are possible in light of the above teaching. It is intended that the scope of the invention be defined by the claims appended hereto.

We claim:
1. A superconductive magnet comprising:
   a) a generally longitudinally extending axis;
   b) a generally annularly-cylindrical-shaped vacuum enclosure generally coaxially aligned with said axis;
   c) a generally annularly-cylindrical-shaped thermal shield generally coaxially aligned with said axis and disposed within and spaced apart from said vacuum enclosure;
   d) a generally solenoidal-shaped superconductive coil generally coaxially aligned with said axis and disposed within and spaced apart from said thermal shield;
   e) a cryocooler coldhead having a housing connected to said vacuum enclosure, a first stage disposed in solid-conductive thermal contact with said thermal shield, and a second stage disposed in solid-conductive thermal contact with said superconductive coil; and
   f) a magnet re-entrant support assembly including:
      (1) a generally annularly-cylindrical-shaped outer support cylinder generally coaxially aligned with said axis, disposed within and generally spaced apart from said vacuum enclosure, disposed outside and generally spaced apart from said thermal shield, having a first end rigidly connected to said vacuum enclosure, and having a second end rigidly connected to said thermal shield; and

(2) a generally annularly-cylindrical-shaped inner support cylinder generally coaxially aligned with said axis, disposed within and generally spaced apart from said thermal shield, disposed outside and generally spaced apart from said superconductive coil, having a first terminus rigidly connected to said thermal shield proximate said second end of said outer support cylinder, and having a second terminus disposed longitudinally between said first and second ends of said outer support cylinder and rigidly connected to said superconductive coil.

2. The magnet of claim 1, wherein said thermal shield has a plurality of spaced-apart and radially-outward-facing circumferential grooves, and wherein said second end of said outer support cylinder includes a radially-inward-extending flange having a plurality of spaced-apart and radially-inward-facing circumferential ridges engaging said radially-outward-facing circumferential grooves of said thermal shield.

3. The magnet of claim 2, wherein said thermal shield has a plurality of spaced-apart and radially-inward-facing circumferential grooves, and wherein said first terminus of said inner support cylinder includes a radially-outward-extending flange having a plurality of spaced-apart and radially-outward-facing circumferential ridges engaging said radially-inward-facing circumferential grooves of said thermal shield.

4. The magnet of claim 3, wherein said radially-inward-extending flange of said second end of said outer support cylinder and said radially-outward-extending flange of said first terminus of said inner support cylinder are generally aligned along a radius line from said axis.

5. The magnet of claim 1, also including a generally annularly-cylindrical-shaped coil overband generally coaxially aligned with said axis, disposed inside and generally spaced apart from said inner support cylinder, disposed outside said superconductive coil, having a first end portion rigidly connected to said second terminus of said inner support cylinder, and having a radially-inward-facing surface rigidly connected to, and in solid-conductive thermal contact with, said superconductive coil.

6. The magnet of claim 5, wherein said coil overband has a second end portion, and wherein said second stage of said cryocooler coldhead is in solid-conductive thermal contact with said second end portion of said coil overband.

7. The magnet of claim 1, wherein said outer support cylinder and said inner support cylinder each comprise a fiberglass cylinder wound from glass fibers with a generally 45 degree by −45 degree overlapping pitch.

8. The magnet of claim 1, wherein said first end of said outer support cylinder has a radially-outward-facing flange rigidly connected to said vacuum enclosure.

9. The magnet of claim 8, wherein said vacuum enclosure includes a first outer mounting ring generally coaxially aligned with said axis, disposed in circumferentially-surrounding contact with said radially-outward-facing flange of said outer support cylinder, and having a generally annular-shaped end longitudinally disposed between said first and second ends of said outer support cylinder, said annular-shaped end including a radially-inward-facing flange radially overlapping and longitudinally abutting said radially-outward-facing flange of said outer support cylinder.

10. The magnet of claim 9, wherein said vacuum enclosure includes a first end plate and a ring clamp, said ring clamp longitudinally disposed to longitudinally hold said radially outward-facing flange of said outer support cylinder longitudinally against said radially-inward-facing flange of said first outer mounting ring, and said ring clamp radially disposed inside and rigidly connected to said first outer mounting ring, wherein said ring clamp and said radially-outward-facing flange of said outer support cylinder together define a radially-inward-facing circumferential notch, and wherein said first end plate has an outer circumferential edge disposed in said radially-inward-facing circumferential notch.

* * * * *